United States Patent
Moon et al.

(10) Patent No.: US 7,211,506 B2
(45) Date of Patent: May 1, 2007

(54) METHODS OF FORMING COBALT LAYERS FOR SEMICONDUCTOR DEVICES

(75) Inventors: Kwang-Jin Moon, Gyeonggi-do (KR); Gil-Heyun Choi, Gyeonggi-do (KR); Sang-Bom Kang, Seoul (KR); Hyun-Su Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 401 days.

(21) Appl. No.: 10/881,231

(22) Filed: Jun. 30, 2004

(65) Prior Publication Data
US 2005/0014365 A1 Jan. 20, 2005

(30) Foreign Application Priority Data
Jul. 15, 2003 (KR) .................. 10-2003-0048235

(51) Int. Cl.
H01L 21/4763 (2006.01)
(52) U.S. Cl. .................. 438/622; 438/687; 438/618; 438/620; 257/E51.001
(58) Field of Classification Search ............. 438/622, 438/687, 618, 620
See application file for complete search history.

(56) References Cited

U.S. PATENT DOCUMENTS

| 5,173,370 | A * | 12/1992 | Takahashi et al. ....... 428/836.3 |
| 6,107,096 | A   | 8/2000  | Mikagi |
| 6,121,140 | A   | 9/2000  | Arena et al. |
| 6,346,477 | B1  | 2/2002  | Kaloyeros et al. |
| 6,444,263 | B1 * | 9/2002 | Paranjpe et al. ............. 427/250 |
| 6,645,847 | B2 * | 11/2003 | Paranjpe et al. ............. 438/622 |
| 6,692,903 | B2 * | 2/2004 | Chen et al. .................. 430/329 |
| 6,800,173 | B2 * | 10/2004 | Chiang et al. ......... 156/345.33 |
| 6,849,122 | B1 * | 2/2005 | Fair ............................ 117/89 |
| 2001/0001045 | A1 * | 5/2001 | Litwin et al. ................ 428/325 |
| 2002/0036320 | A1 * | 3/2002 | Ichimori et al. ............. 257/347 |
| 2002/0102838 | A1 * | 8/2002 | Paranjpe et al. ............. 438/622 |
| 2003/0124267 | A1 | 7/2003 | Kim |

FOREIGN PATENT DOCUMENTS

| JP | 6-89874 A | 3/1994 |
| JP | 8-274047 A | 10/1996 |
| KR | 10-0187658 B1 | 1/1999 |
| KR | 2003-0058040 A | 7/2003 |
| KR | 2004-0033337 A | 4/2004 |

OTHER PUBLICATIONS

Rhee et al., *Epitaxial growth of a (100) $CoSi_2$ layer from carbonic cobalt films deposited on (100) Si substrate using an organometallic source*, Applied Physics Letters, vol. 74, No. 7, Feb. 15, 1999, pp. 1003-1005.
Notice to Submit Response, Korean App. 10-2003-0048235, Apr. 29, 2005, with English language translation.

* cited by examiner

Primary Examiner—Asok K. Sarkar
Assistant Examiner—Victor V. Yevsikov
(74) Attorney, Agent, or Firm—Meyers Bigel Sibley & Sajovec, P.A.

(57) ABSTRACT

The present invention provides methods of forming cobalt layers on a structure comprising forming a preliminary cobalt layer on a semiconductor substrate by introducing an organic metal precursor onto the semiconductor substrate and treating a surface of the preliminary cobalt layer under an atmosphere of a hydrogen-containing gas to remove impurities contained in the preliminary cobalt layer. Compositions of cobalt layers are also provided. Further provided are semiconductor devices comprising cobalt layers provided herein.

15 Claims, 12 Drawing Sheets

METHODS OF FORMING COBALT LAYERS FOR SEMICONDUCTOR DEVICES

RELATED APPLICATION DATA

This application claims priority from Korean Patent Application No. 2003-48235, filed Jul. 15, 2003, the disclosure of which is incorporated herein by reference in its entirety as if set forth fully herein.

FIELD OF THE INVENTION

The present invention relates to methods of forming cobalt layers. More particularly, the present invention relates to methods of forming cobalt layers having a high degree of purity.

BACKGROUND OF THE INVENTION

As information processing apparatus are developed, semiconductor devices possessing high integration and rapid response speed may be desired. However, when the semiconductor devices are highly integrated, the semiconductor devices may have unsuitable characteristics. For example, contact resistances at source/drain regions may increase as the size of the source/drain regions and length of gate electrodes decrease. When a semiconductor device has an increased contact resistance, the semiconductor device may not operate at a high response speed and power consumption of the semiconductor device may increase. To address this concern, a method of forming a metal silicide layer on a gate electrode and source/drain regions of a semiconductor device has been suggested. The metal silicide layer comprises a compound of metal and silicon. For example, the metal silicide layer can include tungsten silicide, titanium silicide, cobalt silicide or the like.

In a conventional method of forming a metal silicide layer, after a titanium layer is formed on a substrate or a silicon containing layer by a sputtering process or a chemical vapor deposition (CVD) process, the titanium layer can be thermally treated to be reacted with silicon contained in the substrate or the silicon containing layer, thereby forming a titanium silicide layer on the substrate or the silicon containing layer. However, the titanium silicide layer may exhibit an increased resistance if the titanium silicide layer is damaged during the thermal treatment process. In contrast, a cobalt silicide layer may be widely employed for a semiconductor device because the cobalt silicide layer may exhibit greater chemical stability and greater stable resistance stability relative to titanium silicide. Additionally, the conventional cobalt silicide layer can be formed by a physical vapor deposition (PVD) process.

In a conventional method of forming a cobalt silicide layer, a cobalt layer can be formed on a silicon substrate or a silicon-containing pattern by a PVD process. The silicon substrate or the silicon-containing pattern having the cobalt layer can be thermally treated to yield reacted cobalt with silicon so that the cobalt silicide layer can be formed on the silicon substrate or the silicon-containing pattern. However, the cobalt silicide layer formed by the PVD process may exhibit poor step coverage. In addition, the cobalt silicide layer formed by the PVD process may not have a uniform thickness when the cobalt silicide layer is formed on predefined patterns or in contact holes.

FIG. 1 presents a cross-sectional view illustrating a conventional method of forming a cobalt layer on a substrate by a PVD process.

Referring to FIG. 1, gate patterns 12 are formed on a semiconductor substrate 10. The gate patterns 12 are separated from each other by a predefined spacing distance. Spacers 14 are formed on sidewalls of the gate patterns 12.

A cobalt layer 16 can be formed on an entire surface of the substrate 10 including the gate patterns 12 and the spacers 14. A portion of the cobalt layer 16 between the gate patterns 12 has a relatively thin thickness compared to that of other portions of the cobalt layer 16 on the substrate 10 and on the gate patterns 12.

When the cobalt layer 16 does not have a uniform thickness on the entire surface of the substrate 10, a cobalt silicide layer formed from the cobalt layer 16 may also have an irregular thickness on the substrate 10. As a result, a semiconductor device including the cobalt silicide layer may have poor electrical characteristics.

U.S. Pat. No. 6,346,477 issued to Kaloyeros presents a method of forming a cobalt layer on a silicon layer by a CVD process using $[Co(CO)_3NO]$ as a precursor. In this method, the silicon layer is oxidized by a reaction between silicon and by-products, including oxygen, that are generated from the precursor and generated in the CVD process. In particular, an interface oxide layer is formed between the silicon layer and the cobalt layer to inhibit a reaction between silicon and cobalt and prevent the formation of a cobalt silicide layer on the silicon layer, even after a subsequent thermal process is carried out with respect to the cobalt layer. Additionally, H. S. Rhee et al. presents a method of forming a cobalt layer on a silicon layer by a metal organic chemical vapor deposition (MOCVD) process in "Applied Physics Letters Vol. 74, No. 7, 1999." In this method, examples of cobalt precursors include $Co_2(CO)_8$, $Co(C_5H_5)_2$, $Co(C_5H_5)(CO)_2$ and $CoCF_3(CO)_4$. However, since the cobalt precursors include carbon and oxygen, impurities including carbon and oxygen may be included in a cobalt layer formed on the silicon layer. When the cobalt layer includes these impurities, the cobalt layer may be unsuitable for semiconductor devices because the cobalt layer may possess high specific resistance.

SUMMARY OF THE INVENTION

In some embodiments, methods of forming cobalt layers on a structure according to the present invention comprise, consist essentially of or consist of forming a preliminary cobalt layer on a semiconductor substrate by introducing an organic metal precursor onto the semiconductor substrate and treating a surface of the preliminary cobalt layer under an atmosphere of a hydrogen-containing gas to remove impurities contained in the preliminary cobalt layer. The treating procedure comprises exposing the surface of the preliminary cobalt layer to a hydrogen-containing gas and an inactive gas at a temperature greater than about 300° C. The inactive gas can be an inert gas. Moreover, the inactive gas can be argon, neon, nitrogen or a combination thereof. Forming the preliminary cobalt layer and treating the surface of the preliminary cobalt layer can be repeatedly performed at least once so as to form a cobalt layer having a desired thickness on the semiconductor substrate. Additionally, forming the preliminary cobalt layer can be carried out by a chemical vapor deposition (CVD) process or an atomic layer deposition (ALD) process. Treating the surface of the preliminary cobalt layer can be performed in the same deposition chamber or separate chambers. The organic metal precursor comprises cobalt, carbon, oxygen or a combination thereof and can be a vapor or liquid. The organic metal precursor can be $Co_2(CO)_6$:(HC≡CtBu), $Co(MeCp)_2$, $Co(CO)_3(NO)$, $Co(CO)_2Cp$, $CoCp_2$, $Co_2(CO)_6$:(HC≡CPh), $Co_2(CO)_6$:(HC≡CH), $Co_2(CO)_6$:(HC≡CCH_3) or $Co_2(CO)_6$:($CH_3C≡CCH_3$) and the like and combinations thereof. The organic metal precursor can be vaporized via a bubbling process so as to form a preliminary cobalt layer on a semiconductor substrate. The vaporized organic metal precursor can be applied onto a silicon substrate loaded in a chamber. In this instance, an inactive gas including, but not limited to, argon, nitrogen, neon and the like, may be provided with the vaporized organic metal precursor as a carrier gas that carries the vaporized organic metal precursor into the chamber. After the vaporized organic metal precursor is provided onto the silicon substrate, a preliminary cobalt layer can be formed on the silicon substrate. The preliminary cobalt layer also may include carbon, oxygen or a combination thereof. When the preliminary cobalt layer contains impurities such as carbon or oxygen, the cobalt layer may exhibit increased specific resistance. In an effort to remove impurities from the preliminary cobalt layer, a surface of the preliminary cobalt layer can be treated under a hydrogen-containing gas atmosphere, thereby forming a cobalt layer on the silicon substrate wherein the cobalt layer can be a pure or substantially pure cobalt layer. The cobalt layer can further be subjected to a silicidation process to provide a cobalt silicide layer. Additionally, the cobalt layer can be formed on a semiconductor substrate comprising a contact hole or a semiconductor substrate having patterns for gate electrodes.

Embodiments of the present invention further provide methods of forming a cobalt layer on a structure comprising, consisting essentially of or consisting of introducing an organic metal precursor onto a semiconductor substrate loaded into a deposition chamber, physisorbing the organic metal precursor onto the semiconductor substrate, chemisorbing the organic metal precursor onto the semiconductor substrate, introducing a purge gas into the deposition chamber, forming an atomic preliminary cobalt layer from the organic metal precursor by removing the physisorbed portion of the organic metal precursor from the semiconductor substrate and treating a surface of the preliminary cobalt layer under a hydrogen-containing gas atmosphere to remove impurities contained in the preliminary cobalt layer. The procedures of introducing the organic metal precursor, physisorbing the organic metal precursor, chemisorbing the organic metal precursor, introducing the purge gas, and forming the atomic preliminary cobalt layer so as to form a preliminary cobalt layer on the semiconductor substrate can optionally be repeated. The treating procedure comprises exposing the surface of the preliminary cobalt layer to a hydrogen-containing gas and an inactive gas at a temperature greater than about 300° C. The inactive gas can be an inert gas. Moreover, the inactive gas can be argon, neon, nitrogen or a combination thereof. The organic metal precursor comprises carbon, oxygen or a combination thereof and can be a vapor or liquid. The organic metal precursor can include, but is not limited to, $Co_2(CO)_6$:(HC≡CtBu), $Co(MeCp)_2$, $Co(CO)_3(NO)$, $Co(CO)_2Cp$, $CoCp_2$, $Co_2(CO)_6$:(HC≡CPh), $Co_2(CO)_6$:(HC≡CH), $Co_2(CO)_6$:(HC≡CCH_3) or $Co_2(CO)_6$:($CH_3C≡CCH_3$) and the like and combinations thereof. The organic metal precursor for forming the cobalt layer can be vaporized via a bubbling process as described above. Moreover, the cobalt layer can further be subjected to a silicidation process to provide a cobalt silicide layer. Additionally, the cobalt layer can be formed on a semiconductor substrate comprising a contact hole or a semiconductor substrate having patterns for gate electrodes.

In still other embodiments, the preliminary cobalt layer can be treated using plasma. The plasma can be a hydrogen-containing plasma. Moreover, the plasma can be generated directly inside the deposition chamber or outside the deposition chamber. When the plasma is generated outside the chamber, the plasma can be generated by a remote plasma process.

BRIEF DESCRIPTION OF THE DRAWINGS

Some of the above features and advantages of the present invention will become readily apparent by reference to the following detailed description when considered in conjunction with the accompanying drawings wherein.

DETAILED DESCRIPTION OF EMBODIMENTS ACCORDING TO THE INVENTION

Figure 1:
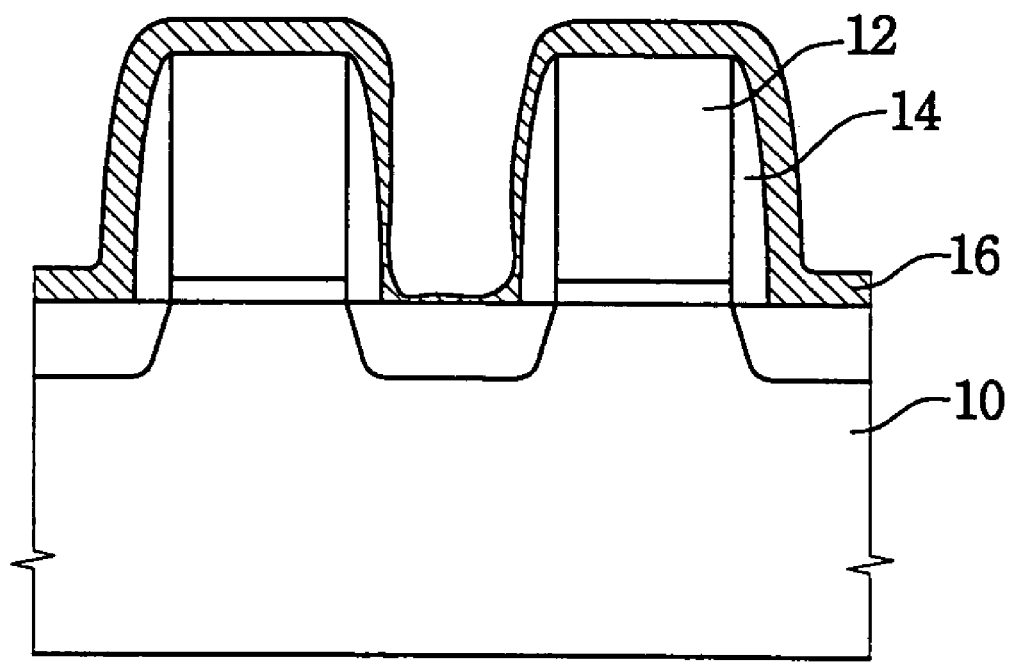
FIG. 1 presents a cross-sectional view of a cobalt layer on a semiconductor substrate having gate electrodes thereon.

The present invention now will be described more fully hereinafter with reference to the accompanying drawings, in which some embodiments of the present invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

The terminology used in the description of embodiments according to the invention herein is for the purpose of describing particular embodiments only and is not intended to be limiting of the invention. As used in the description of the embodiments of the invention and the appended claims, the singular forms "a", "an" and "the" are intended to include the plural forms as well, unless the context clearly indicates otherwise.

Unless otherwise defined, all terms, including technical and scientific terms used in the description of the invention, have the same meaning as commonly understood by one of ordinary skill in the art to which this invention belongs. All publications, patent applications, patents, and other references mentioned herein are incorporated by reference in their entirety.

It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

Moreover, it will be understood that steps comprising the methods provided herein can be performed independently or at least two steps can be combined when the desired outcome can be obtained. Additionally, steps comprising the methods provided herein, when performed independently or combined, can be performed at the same temperature or at different temperatures without departing from the teachings of the present invention.

In the drawings, the thickness of layers and regions are exaggerated for clarity. Like reference numerals refer to similar or identical elements throughout. It will be understood that when an element such as a layer, region or substrate is referred to as being "on" or "onto" another element, it can be directly on the other element or intervening elements may also be present.

As will be appreciated by one of ordinary skill in the art, the present invention may be embodied as compositions and devices as well as methods of making and using such compositions and devices.

As used herein, "cobalt layer" refers to a layer comprising, consisting essentially of or consisting of cobalt. Examples of cobalt layers include, but are not limited to, layers comprising, consisting essentially of or consisting of cobalt, cobalt silicide and the like. The semiconductor substrates described herein can include silicon or a derivative thereof. For example, the semiconductor substrates can include tungsten silicide, titanium silicide, cobalt silicide or a combination thereof.

According to embodiments of the present invention, methods of forming a cobalt layer as described herein can provide a cobalt layer having high purity and good step coverage formed on a semiconductor substrate. Aspects of the present invention will be further explained with reference to certain examples, which are included herein for illustration purposes only, and which are not intended to be limiting of the invention.

EXAMPLE 1

Figure 2:
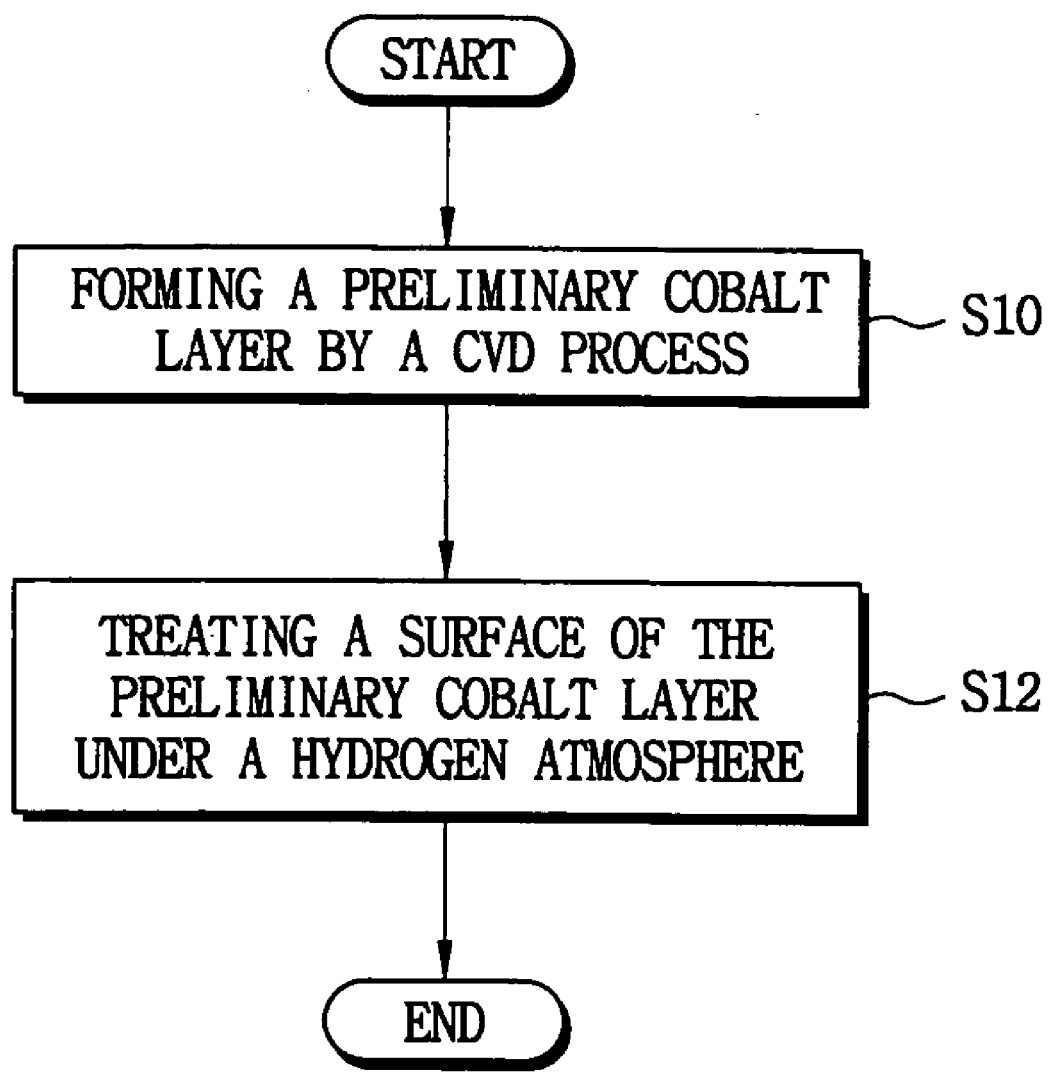
FIG. 2 presents a flow chart illustrating a method of forming a cobalt layer in accordance with some embodiments of the present invention.
Figure 3:
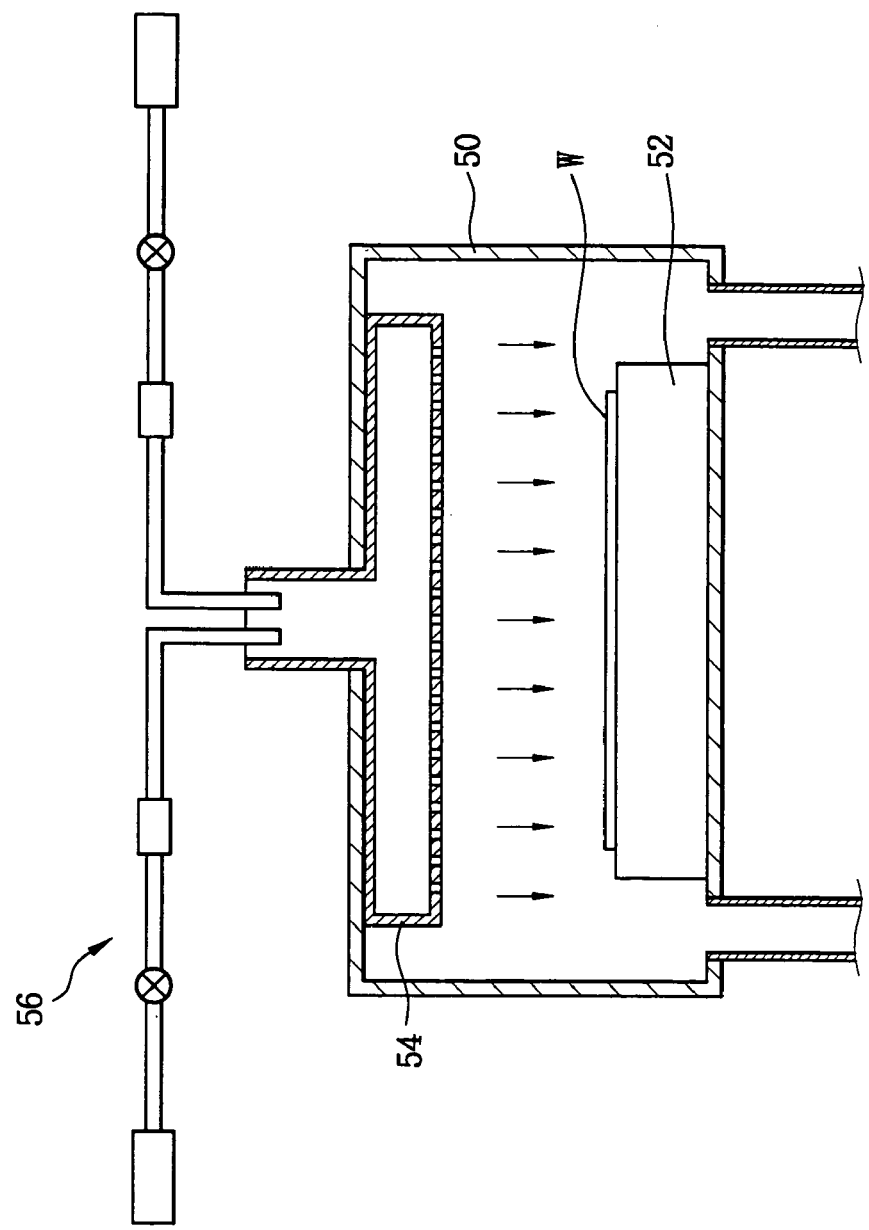
FIG. 3 presents a schematic cross-sectional view illustrating a showerhead type chemical vapor deposition (CVD) apparatus for forming a cobalt layer in accordance with some of the embodiments of the present invention.
Figure 4:
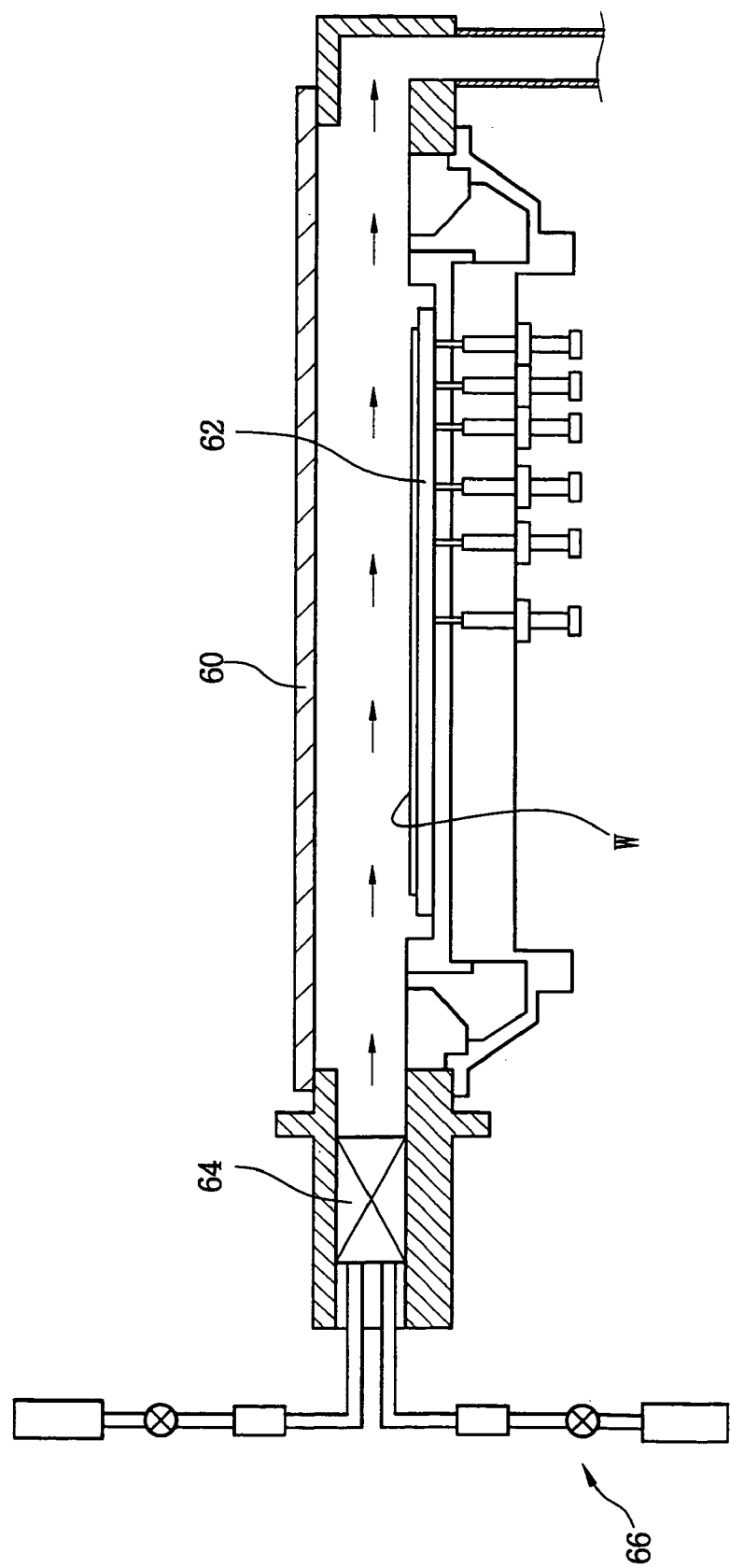
FIG. 4 presents a schematic cross-sectional view illustrating a gas injection type CVD apparatus for forming the cobalt layer in accordance with some embodiments of the present invention.

FIG. 2 presents a flow chart illustrating a method of forming a cobalt layer in accordance with some embodiments of the present invention. FIGS. 3 and 4 present schematic cross sectional views illustrating a deposition apparatus for forming a cobalt layer in accordance with the present invention. FIG. 3 shows a showerhead type chemical vapor deposition (CVD) apparatus, and FIG. 4 shows a gas injection type CVD apparatus.

Referring to FIG. 3, the showerhead type CVD apparatus includes a chamber 50 for carrying out a deposition process, a chuck 52 for loading a substrate thereon, a showerhead 54 for providing a gas onto the substrate, and a gas supply line 56 connected to the showerhead 54 to provide the gas onto the substrate.

Referring to FIG. 4, the gas injection type CVD apparatus includes a chamber 60 for performing a deposition process, a chuck 62 for loading a substrate thereon, a gas injector 64 for providing a gas into the chamber 60 along a predetermined direction, and a gas supply line 66 connected to the gas injector 64 to provide the gas onto the substrate. Here, the gas injector 64 is positioned at one side portion of the chamber 60.

The methods of forming cobalt layers according to embodiments of the present invention may be carried out using the showerhead type or the gas injection type CVD apparatus.

In procedure S10, shown in FIG. 2, after placing a silicon substrate in the chamber 50 or 60, a cobalt precursor in a vapor phase can be introduced into the chamber 50 or 60. The cobalt precursor may include, but is not limited to, $Co_2(CO)_6$:(HC≡CtBu), $Co(MeCp)_2$, $Co(CO)_3(NO)$, $Co(CO)_2Cp$, $CoCp_2$, $Co_2(CO)_6$:(HC≡CPh), $Co_2(CO)_6$:(HC≡CH), $Co_2(CO)_6$:(HC≡CCH_3)$, $Co_2(CO)_6$:$(CH_3C≡CCH_3)$ or a mixture thereof. Additionally, a hydrogen gas or a silane ($SiH_4$) gas can be introduced into the chamber 50 or 60 as a reaction gas that is reacted with the cobalt precursor. A preliminary cobalt layer having a desired thickness can be formed on the substrate in accordance with a reaction between the reaction gas and the cobalt precursor. The preliminary cobalt layer can be formed at a temperature of about 100 to about 200° C.

In procedure S12, shown in FIG. 2., the substrate having the preliminary cobalt layer thereon can be treated at a temperature of above about 300° C. so that a surface of the preliminary cobalt layer can be treated in the chamber 50 or 60 by providing a hydrogen gas onto the substrate. The hydrogen gas can be introduced into the chamber at a flow rate of greater than about 300 sccm to be sufficiently reacted with impurities included in the preliminary cobalt layer. Here, an inactive gas (or an inert gas) can be provided into the chamber with the hydrogen gas. The inactive gas can regulate a pressure of the chamber, and may carry the hydrogen gas into the chamber. The inactive gas may include argon, neon or nitrogen. The hydrogen gas may remove the impurities included in the preliminary cobalt layer after being reacted with the impurities such as carbon or oxygen included in the preliminary cobalt layer. After completing S12, a cobalt layer without impurities or having substantially no impurities therein can be formed on the substrate.

Forming the preliminary cobalt layer S10 and treating the surface of the preliminary cobalt layer S12 may be performed using one chamber. Alternatively, S10 and S12 may be separately performed using separate chambers, respectively.

Figure 5:
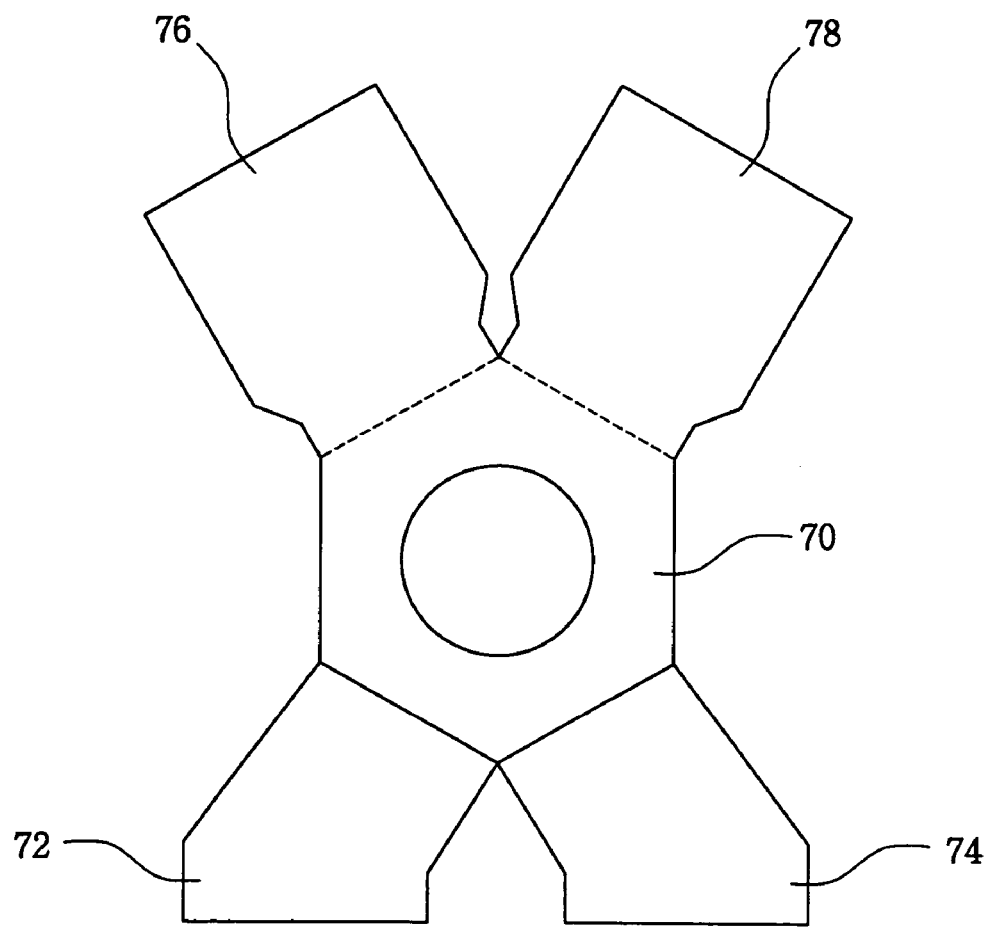
FIG. 5 presents a schematic plane view illustrating a multi-chamber system for forming a cobalt layer in accordance with some embodiments of the present invention.

FIG. 5 presents a schematic plane view illustrating a multi-chamber system for forming the cobalt layer in accordance with embodiments of the present invention.

Referring to FIG. 5, the multi-chamber system can include a transferring chamber 70, a loading section 72, an unloading section 74, a deposition chamber 76, and a surface treatment chamber 78. The deposition chamber 76 may have the construction shown in FIG. 3 or FIG. 4.

Since processing conditions forming the preliminary cobalt layer S10 is distinct from treating the surface of the preliminary cobalt layer S12, S10 and S12 may be performed using separate chambers of the multi-chamber system.

EXAMPLE 2

Figure 6:
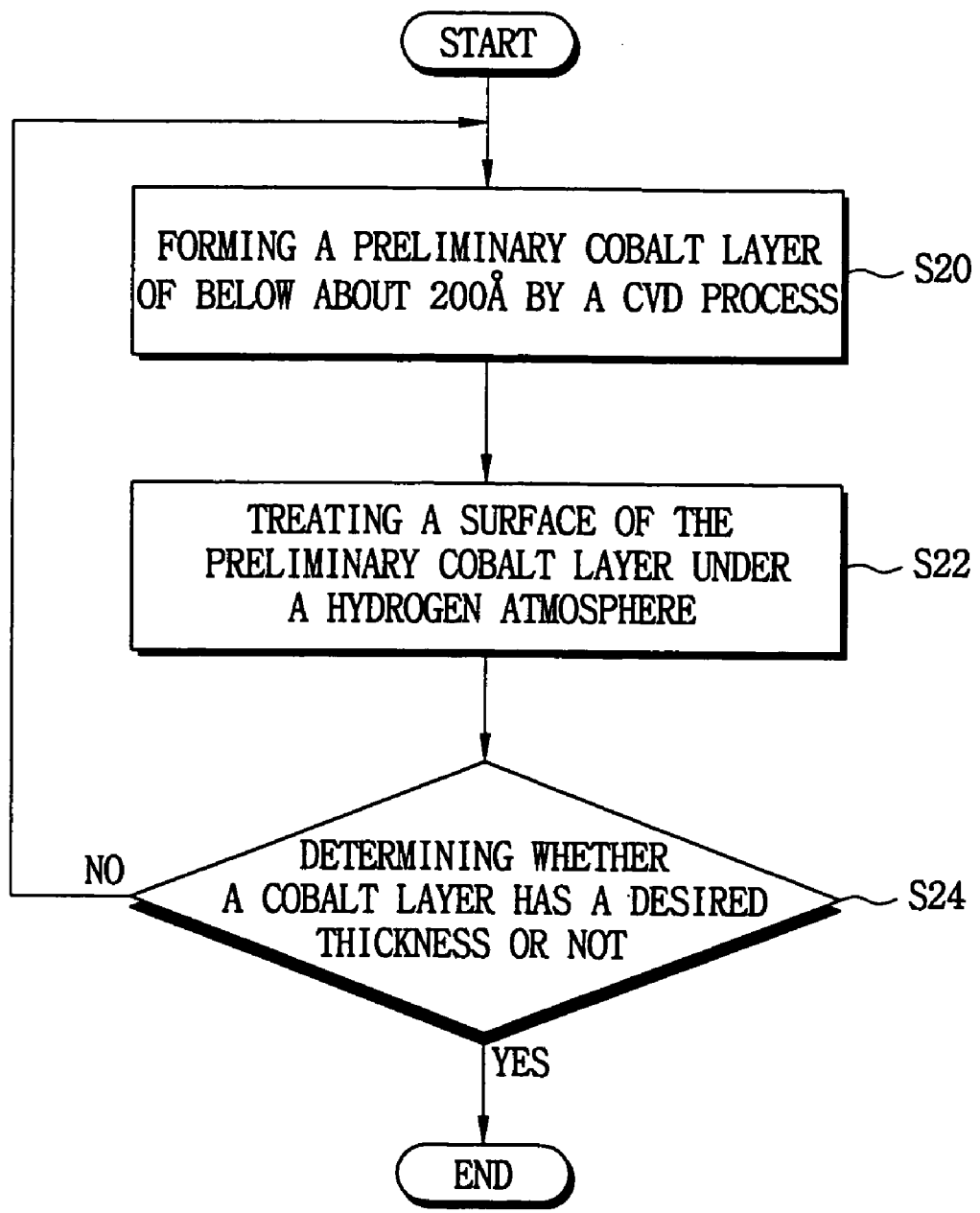
FIG. 6 presents a flow chart illustrating a method of forming a cobalt layer in accordance with some embodiments of the present invention.

FIG. 6 presents a flow chart illustrating a method of forming a cobalt layer in accordance with embodiments of the present invention.

In particular embodiments, the methods of forming cobalt layers are similar to the methods described in Example 1, except for alternately forming a preliminary cobalt layer and treating a surface of the preliminary cobalt layer.

Referring to FIG. 6, after placing a silicon substrate into a first chamber, a cobalt precursor in a vapor phase can be introduced into the first chamber. A hydrogen gas can be introduced into the first chamber as a reaction gas for being reacted with the cobalt precursor.

In procedure S20, the first preliminary cobalt layer can be formed on the silicon substrate in accordance with a reaction between the reaction gas and the cobalt precursor. The first preliminary cobalt layer can be formed to have a thickness less than that of a desired cobalt layer. In some embodiments, the first preliminary cobalt layer can be formed to have a thickness of below about 200 Å so that impurities contained in the first preliminary cobalt layer may be effectively removed in a procedure for treating a surface of the first preliminary cobalt layer. In other embodiments, the first preliminary cobalt layer has a thickness of below about 50 Å. The first preliminary cobalt layer can be formed at a temperature of about 100 and about 200° C.

The substrate having the first preliminary cobalt layer thereon can be loaded into a second chamber of a multi-chamber system. After loading the substrate into the second chamber, the substrate can be treated at a temperature of above about 300° C. A surface of the first preliminary cobalt layer on the substrate can be treated by introducing a hydrogen gas into the second chamber. In this instance, an inactive gas can be introduced into the second chamber with the hydrogen gas. The inactive gas can regulate the pressure of the second chamber, and may carry the hydrogen gas into the second chamber. The inactive gas can include, but is not limited to, argon, neon or nitrogen. In procedure S22, impurities included in the first preliminary cobalt layer can be removed by treating the surface of the first cobalt layer, thereby forming a first cobalt layer on the substrate. Alternatively, S20 and S22 may be carried out using one chamber.

In procedure S24, when the first cobalt layer having a desired thickness is not formed on the substrate through S20 and S22, a second preliminary cobalt layer may be formed on the first cobalt layer. Particularly, the substrate on which the first cobalt layer is formed can be loaded into the first chamber. The temperature of the first chamber can be maintained at about 100° C. to about 200° C. After loading the substrate into the first chamber, a cobalt precursor in a vapor phase can be introduced into the first chamber. A hydrogen gas can be introduced into the first chamber as a reaction gas for being reacted with the cobalt precursor. The second preliminary cobalt layer can be formed on the first cobalt layer on the silicon substrate in accordance with a reaction between the reaction gas and the cobalt precursor.

After loading the substrate on which the second preliminary cobalt layer is formed into the second chamber, a cobalt layer having the desired thickness can formed on the substrate by treating a surface of the second preliminary cobalt layer using a hydrogen gas as described above.

Forming the preliminary cobalt layers and treating the surfaces of the preliminary cobalt layers may be alternately performed several times, thereby forming a cobalt layer of the desired thickness on the substrate.

When the preliminary cobalt layers have a relatively thin thickness, the impurities included in the preliminary cobalt layers may be effectively removed using the hydrogen gas. Therefore, a final cobalt layer may exhibit a desirable specific resistance when forming the preliminary cobalt layers and treating the surfaces of the preliminary cobalt layers are alternately performed several times.

EXAMPLE 3

According to some embodiments, methods of forming cobalt layers are similar to those described in Example 1.

Cobalt layers according to some embodiments of the present invention may be formed using the showerhead type CVD apparatus or the gas injection type CVD apparatus illustrated in FIGS. 3 and 4. In this instance, a plasma generation member for forming plasma using a radio frequency (RF) power can be installed in the chamber of the showerhead type CVD apparatus or the gas injection type CVD apparatus.

After disposing a silicon substrate in the chamber, a cobalt precursor in a vapor phase can be introduced into the chamber. In addition, a hydrogen gas can be introduced into the chamber as a reaction gas that is reacted with the cobalt precursor. A preliminary cobalt layer can be formed on the substrate in accordance with a reaction between the cobalt precursor and the hydrogen gas. The preliminary cobalt layer can be formed on the substrate at a temperature of about 100 to about 200° C.

The RF power for generating the plasma can be applied to the plasma-generating member of the chamber, wherein the substrate having the preliminary cobalt layer thereon is loaded. An argon gas can be introduced into the chamber as a plasma source gas. Additionally, a surface of the preliminary cobalt layer can be treated by providing a hydrogen gas into the chamber for removing impurities included in the preliminary cobalt layer. The hydrogen gas can be introduced into the chamber at a flow rate of greater than about 300 sccm.

Forming the preliminary cobalt layer and treating the surface of the preliminary cobalt layer may be performed more than once, thereby forming a desired cobalt layer on the substrate. Alternatively, forming the preliminary cobalt layer and treating the surface of the preliminary cobalt layer may be alternately performed for several times, thereby forming the desired cobalt layer on the substrate.

The preliminary cobalt layer formed on the substrate can have a thickness of below about 200 Å when forming the preliminary cobalt layer and treating the surface of the preliminary cobalt layer are alternately performed. In some embodiments, the preliminary cobalt layer has a thickness of below about 50 Å.

Forming the preliminary cobalt layer and treating the surface of the preliminary cobalt layer with the hydrogen gas may be performed in-site (in one chamber). Alternatively, forming the preliminary cobalt layer and treating the surface of the preliminary cobalt layer with the hydrogen gas may be carried out in separate chambers of the multi-chamber system.

EXAMPLE 4

In some embodiments, methods of forming cobalt layers are similar to those described in Example 1.

Cobalt layers according to some embodiments of the present invention may be formed using the showerhead type CVD apparatus or the gas injection type CVD apparatus illustrated in FIGS. 3 and 4. However, a remote plasma generating member may be provided outside the chamber of the showerhead type CVD apparatus or the gas injection type CVD apparatus.

After disposing a silicon substrate in the chamber, a cobalt precursor in a vapor phase can be introduced into the chamber. A hydrogen gas can be introduced into the chamber as a reaction gas for being reacted with the cobalt precursor. A preliminary cobalt layer can be formed on the substrate in accordance with a reaction between the cobalt precursor and the hydrogen gas. The preliminary cobalt layer can be formed at a temperature of about 100° C. and about 200° C.

A hydrogen gas can be excited outside of the chamber by a remote plasma process. After exciting the hydrogen gas to generate hydrogen radicals, a surface of the preliminary cobalt layer can be treated in the chamber by providing the hydrogen radicals onto the preliminary cobalt layer.

A desired cobalt layer may be formed on the substrate by forming the preliminary cobalt layer and treating the surface of the preliminary cobalt layer once. Alternatively, forming the preliminary cobalt layer and treating the surface of the preliminary cobalt layer may be alternately performed several times, thereby forming the desired cobalt layer on the substrate. The preliminary cobalt layer can be formed on the substrate to have a thickness of below about 200 Å when forming the preliminary cobalt layer and treating the surface of the preliminary cobalt layer are alternately performed. In some embodiments, the preliminary cobalt layer has a thickness of below about 50 Å.

Forming the preliminary cobalt layer and treating the surface of the preliminary cobalt layer with the hydrogen gas may be performed in-situ (in one chamber). Alternatively, forming the preliminary cobalt layer and treating the surface of the preliminary cobalt layer with hydrogen gas may be carried out using separate chambers of the multi-chamber system.

EXAMPLE 5

In some embodiments, methods of forming cobalt layers are similar to those described in Example 1, further noting that forming a preliminary cobalt layer can be accomplished by an atomic layer deposition (ALD) process.

Figure 7:
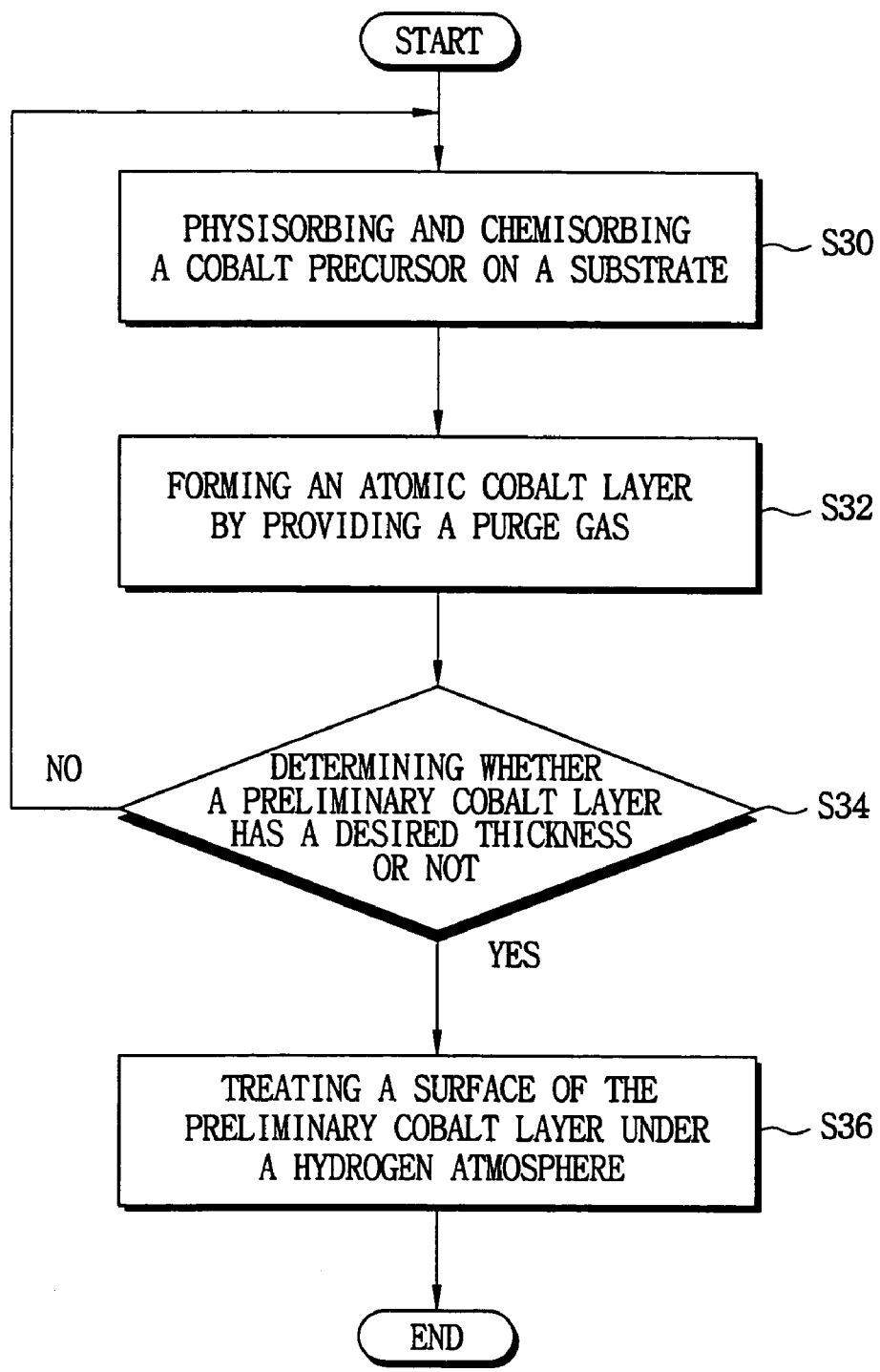
FIG. 7 presents a flow chart illustrating a method of forming a cobalt layer in accordance with some embodiments of the present invention.

FIG. 7 presents a flow chart illustrating the method of forming the cobalt layer in accordance with some embodiments of the present invention.

Referring to FIG. 7, after a substrate is loaded in a deposition chamber, a cobalt precursor is provided onto the substrate.

In procedure S30, a first portion of the cobalt precursor can be physisorbed on a surface of the substrate, whereas a second portion of the cobalt precursor can be chemisorbed on the surface of the substrate by providing the cobalt precursor in a vapor phase onto the substrate.

In procedure S32, the physisorbed first portion of the cobalt precursor can be removed from the substrate by introducing a purge gas into the deposition chamber, thereby forming an atomic cobalt layer on the substrate. The purge gas can include an inactive gas such as a nitrogen gas, neon gas, argon gas or the like.

Introducing the cobalt precursor and introducing the purge gas can be repeatedly performed, thereby forming a preliminary cobalt layer having a desired thickness on the wafer.

In procedure S36, the substrate having the preliminary cobalt layer thereon can be treated at a temperature of above about 300° C. so that a surface of the preliminary cobalt layer can be treated in the deposition chamber by providing a hydrogen gas onto the substrate. The hydrogen gas can be introduced into the deposition chamber at a flow rate of greater than about 300 sccm to be sufficiently reacted with impurities included in the preliminary cobalt layer. In this instance, an inactive gas can be additionally provided into the deposition chamber with the hydrogen gas. The inactive gas may regulate the pressure of the deposition chamber, and can carry the hydrogen gas into the deposition chamber. The inactive gas may include an argon gas, neon gas, nitrogen gas, or the like.

Forming the preliminary cobalt layer and treating the surface of the preliminary cobalt layer with hydrogen gas may be performed in-situ (in one chamber). Alternatively, the forming the preliminary cobalt layer and treating the surface of the preliminary cobalt layer with hydrogen gas may be carried out using separate chambers of the multi-chamber system.

EXAMPLE 6

In some embodiments, methods of forming cobalt layers are similar to those described in Example 5 with additional procedures including alternately forming a preliminary cobalt layer and a treating a surface of the preliminary cobalt layer by an ALD process.

Figure 8:
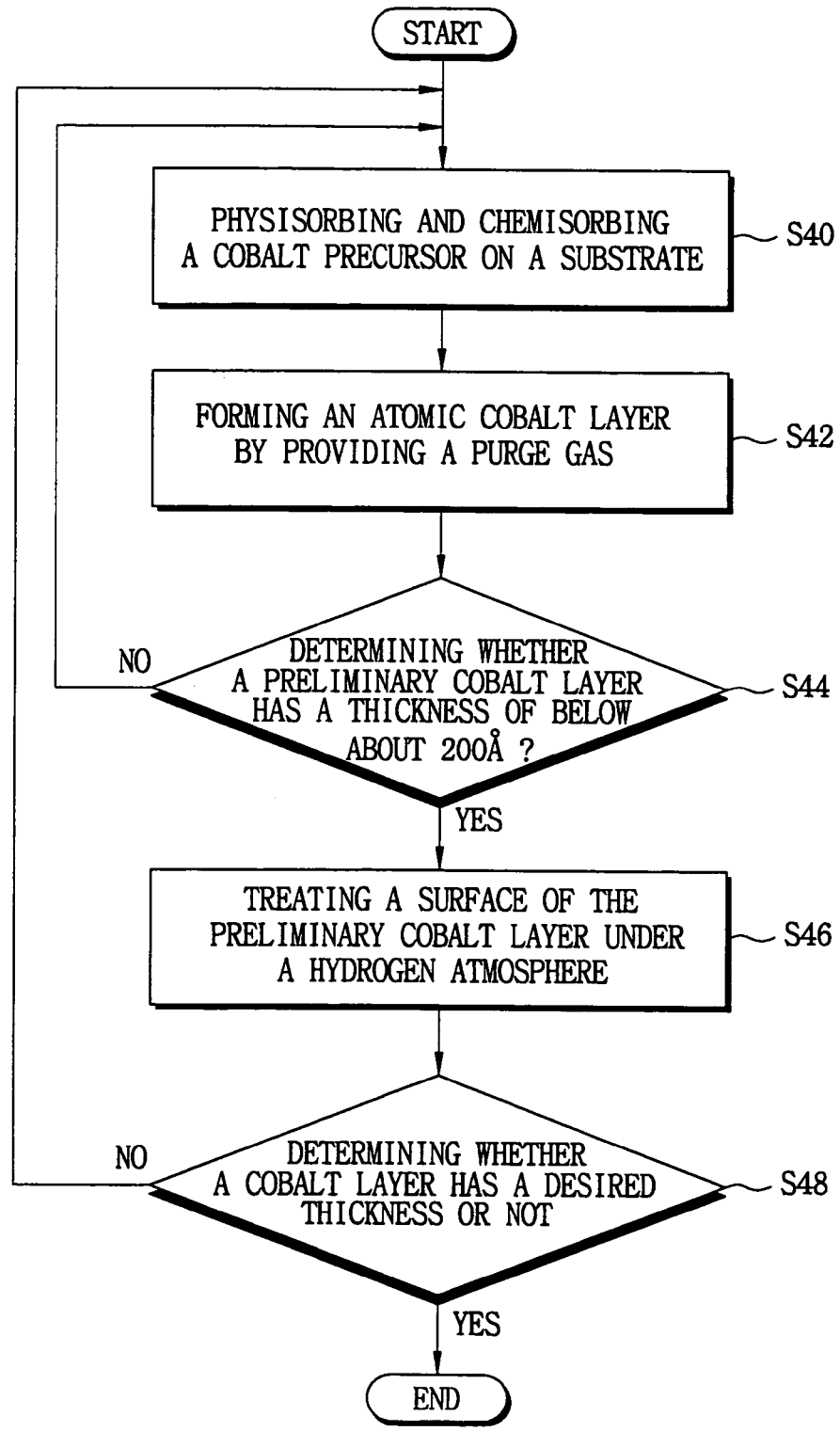
FIG. 8 presents a flow chart illustrating a method of forming a cobalt layer in accordance with some embodiments of the present invention.

FIG. 8 presents a flow chart illustrating a method of forming a cobalt layer in accordance with some embodiments of the present invention.

Referring to FIG. 8, a substrate is loaded into a deposition chamber. In procedure S40, a first portion of a cobalt precursor can be physisorbed on the substrate, whereas a second portion of the cobalt precursor can be chemisorbed on the substrate by introducing the cobalt precursor in a vapor phase into the deposition chamber.

In procedure S42, the physisorbed first portion of the cobalt precursor can be removed by introducing a purge gas into the deposition chamber, thereby forming an atomic cobalt layer on the substrate.

In procedure S44, introducing the cobalt precursor and introducing the purge gas are repeatedly performed, thereby forming a first preliminary cobalt layer having a thickness less than that of a desired cobalt layer. In some embodiments, the first preliminary cobalt layer can be formed to have a thickness of below about 200 Å so that impurities contained in the first preliminary cobalt layer may be effectively removed in a subsequent step for treating a surface of the first preliminary cobalt layer.

In procedure S46, after forming the first preliminary cobalt layer, the substrate having the first preliminary cobalt layer thereon can be treated at a temperature of above about 300° C. so that a surface of the first preliminary cobalt layer can be treated in the deposition chamber by providing a hydrogen gas onto the substrate. Impurities contained in the first preliminary cobalt layer can be removed by treating the surface of the first preliminary cobalt layer, thereby forming a first cobalt layer on the substrate.

In procedure S48, when a thickness of the first cobalt layer is less than that of the desired cobalt layer, absorbing the cobalt precursor by introducing the cobalt precursor in the vapor phase S40 and forming the atomic cobalt layer by introducing the purge gas into the deposition chamber S42 can be repeatedly performed. A second preliminary cobalt layer having a thickness of below about 200 Å can be formed after performing S48.

In procedure S46, after forming the second preliminary cobalt layer, the substrate having the second preliminary cobalt layer thereon can be treated at a temperature of above about 300° C. using a hydrogen gas, thereby forming a second cobalt layer including no impurities on the substrate. Alternatively, an N-th preliminary cobalt layer (wherein N is a positive integer) may be formed by repeatedly performing S44 and S46 so that an N-th cobalt layer may be formed by treating the substrate having the N-th preliminary cobalt layer thereon with the hydrogen gas.

In procedure S48, S40, S42, S44 and S46 may be repeatedly performed until a cobalt layer having a desired thickness is formed on the substrate, thereby forming a cobalt layer having little or no impurities on the substrate.

EXAMPLE 7

In some embodiments, methods of forming cobalt layers are similar to those described in Example 5.

A preliminary cobalt layer according to some embodiments of the present invention can be formed using a process similar to that as described in Example 5. Power for generating plasma can be applied to a plasma-generating member of a chamber, wherein a substrate having the preliminary cobalt layer thereon can be loaded. An argon gas can be introduced into the chamber as a plasma source gas. The surface of the preliminary cobalt layer can be treated by providing a hydrogen gas onto the preliminary cobalt layer for removing impurities included in the preliminary cobalt layer. The hydrogen gas can be introduced into the chamber at a flow rate of greater than about 300 sccm.

Forming the preliminary cobalt layers and treating the surface of the preliminary cobalt layers may be performed once thereby forming a desired cobalt layer on the substrate. Alternatively, forming the preliminary cobalt layer and treating the surface of the preliminary cobalt layer may be alternately performed for several times, thereby forming the desired cobalt layer on the substrate. The preliminary cobalt layer can be formed on the substrate to have a thickness of below about 200 Å when forming the preliminary cobalt layer and treating the surface of the preliminary cobalt layer are alternately performed.

EXAMPLE 8

In some embodiments, methods of forming cobalt layers are similar to those described in Example 5.

A preliminary cobalt layer according to some embodiments of the present embodiment can be formed using a process similar to that described in Example 5. A hydrogen gas can be excited outside the chamber by a remote plasma process. After exciting the hydrogen gas to form hydrogen radicals, a surface of the preliminary cobalt layer can be treated in the chamber by providing the hydrogen radicals onto the preliminary cobalt layer.

A desired cobalt layer can be formed on the substrate by forming the preliminary cobalt layer and treating the surface of the preliminary cobalt layer once. Alternatively, forming the preliminary cobalt layer and treating the surface of the preliminary cobalt layer may be alternately performed for several times, thereby forming the desired cobalt layer on the substrate. The preliminary cobalt layer can be formed on the substrate to have a thickness of below about 200 Å when forming the preliminary cobalt layer and treating the surface of the preliminary cobalt layer are alternately performed.

EXAMPLE 9

Figure 9:
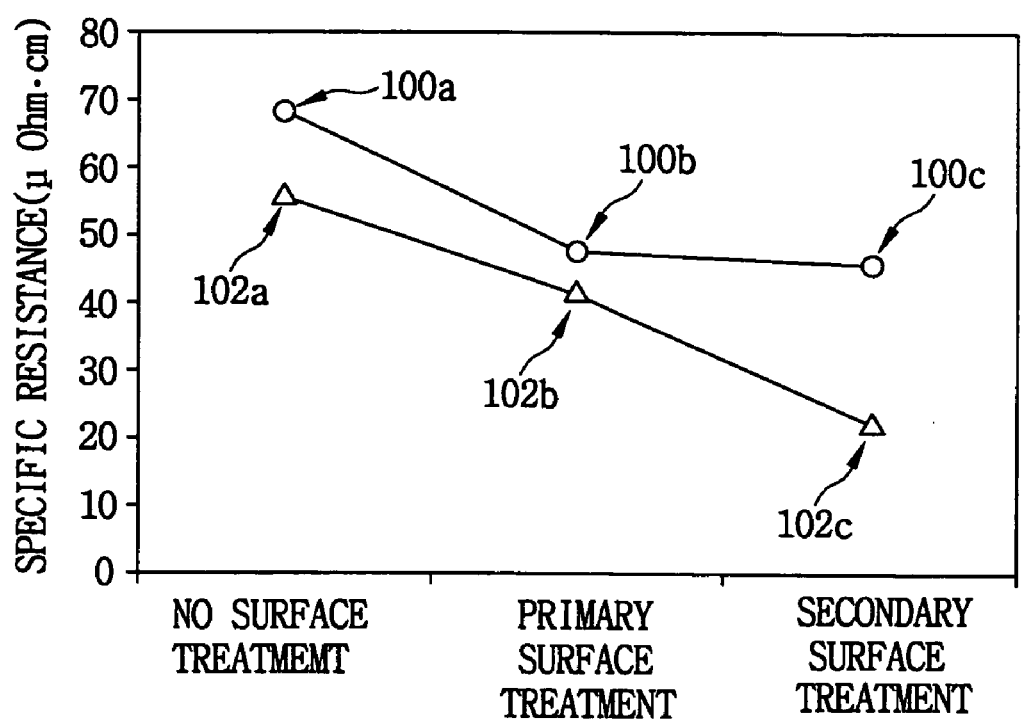
FIG. 9 presents a graph illustrating specific resistances of cobalt and cobalt silicide layers of the present invention relative to specific resistances of conventional cobalt and cobalt silicide layers.

FIG. 9 presents a graph illustrating specific resistances of cobalt layers of the present invention relative to specific resistances of conventional cobalt layers. FIG. 9 also illustrates specific resistances of cobalt silicide layers according to embodiments of the present invention relative to specific resistances of conventional cobalt silicide layers. In this instance, the cobalt silicide layers were obtained after treating the cobalt layers by a rapid thermal process. In FIG. 9, the X-axis represents surface treatment of the cobalt and cobalt silicide layers and the Y-axis indicates specific resistances of the cobalt and cobalt silicide layers. In addition, reference numerals 100*a* to 100*c* indicate specific resistances of the cobalt layers formed on silicon oxide ($SiO_2$) layers, and reference numerals 102*a* to 102*c* indicate specific resistances of the cobalt silicide layers formed on silicon (Si) substrates.

As shown in FIG. 9, the cobalt layer 100*a* having a thickness of about 200 Å was formed on the silicon oxide layer by a CVD process. Here, the cobalt layer 100*a* had a specific resistance of about 65 and about 70 $\mu\Omega$·cm.

The cobalt layer 100*b* having a thickness of about 200 Å was formed by a CVD process. After forming the cobalt layer 100*b*, a surface of the cobalt layer 100*b* was treated at a temperature of about 300° C. using a hydrogen gas in accordance with embodiments of the present invention described in Example 1. In this instance, the surface-treated cobalt layer with the hydrogen gas had a specific resistance of about 45 $\mu\Omega$·cm and about 50 $\mu\Omega$·cm.

A first preliminary cobalt layer having a thickness of about 100 Å was formed by a CVD process. After forming the first preliminary cobalt layer, a surface of the first preliminary cobalt layer was treated at a temperature of about 300° C. using hydrogen gas in accordance with embodiments of the present invention described in Example 2. A second preliminary cobalt layer having a thickness of about 100 Å was additionally formed on the first preliminary cobalt layer treated using the hydrogen gas. After forming the second preliminary cobalt layer, a surface of the second preliminary cobalt layer was treated at a temperature of about 300° C. using a hydrogen gas to obtain the cobalt layer 100*c*. The cobalt layer 100*c* had a specific resistance of about 45 $\mu\Omega$·cm and about 50 $\mu$106 ·cm.

After forming a cobalt layer having a thickness of about 200 Å without a surface treatment using a hydrogen gas, the cobalt silicide layer 102*a* was formed by treating the cobalt layer with a rapid thermal process. Here, the cobalt silicide layer 102*a* had a specific resistance of about 55 $\mu\Omega$·cm.

A cobalt layer having a thickness of about 200 Å was formed on the silicon substrate. After forming the cobalt layer, a surface of the cobalt layer was treated using a hydrogen gas. The cobalt silicide layer 102*b* having a specific resistance of about 40 $\mu\Omega$·cm was formed by treating the cobalt layer with a rapid thermal process.

A cobalt layer having a thickness of about 100 Å was formed on the silicon substrate. After forming the cobalt layer, a surface of the cobalt layer was treated at a temperature of about 300° C. using a hydrogen gas. Subsequently, an additional cobalt layer having a thickness of about 100 Å was formed on the cobalt layer treated using the hydrogen gas. After forming the additional cobalt layer, the entire cobalt layer was treated at a temperature of about 300° C. using a hydrogen gas. With a rapid thermal process, the cobalt silicide layer 102c was formed on the silicon substrate. Here, the cobalt layer 102c had a specific resistance of about 20 μΩ·cm.

As described above, when the cobalt layer was formed by the CVD process, and then the surface of the cobalt layer was treated using the hydrogen gas, the specific resistance of the cobalt layer was reduced by about 30% compared to the cobalt layer without the surface treatment. In addition, when forming the cobalt layer by the CVD process and treating the surface of the cobalt layer were alternately performed, the specific resistance of the cobalt layer was reduced by about 36% compared to the cobalt layer without the surface treatment.

Meanwhile, when the cobalt silicide layer was formed by the rapid thermal process after treating the surface of the cobalt layer using the hydrogen gas, the specific resistance of the cobalt silicide layer was reduced by about 27% when compared to the cobalt silicide layer formed without the surface treatment. Additionally, when the cobalt silicide layer was formed by the rapid thermal process after alternately performing the step for forming the cobalt layer and the step for treating the surface of the cobalt layer, the specific resistance of the cobalt silicide layer was reduced by about 55% when compared to the cobalt silicide layer formed without the surface treatment.

EXAMPLE 10

Figure 10:
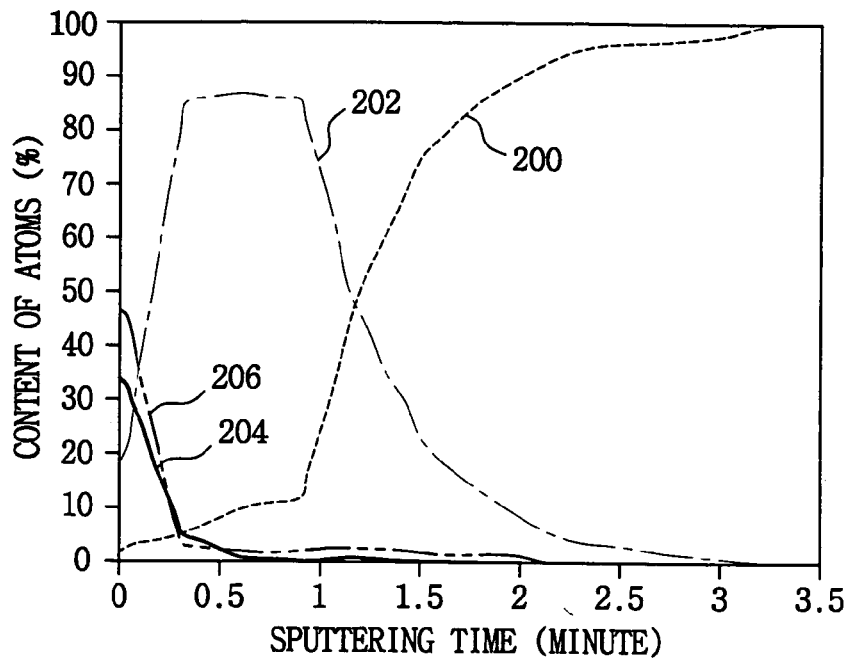
FIG. 10 presents a graph illustrating a result from an AES analysis of a cobalt layer in accordance with some embodiments of the present invention.
Figure 11:
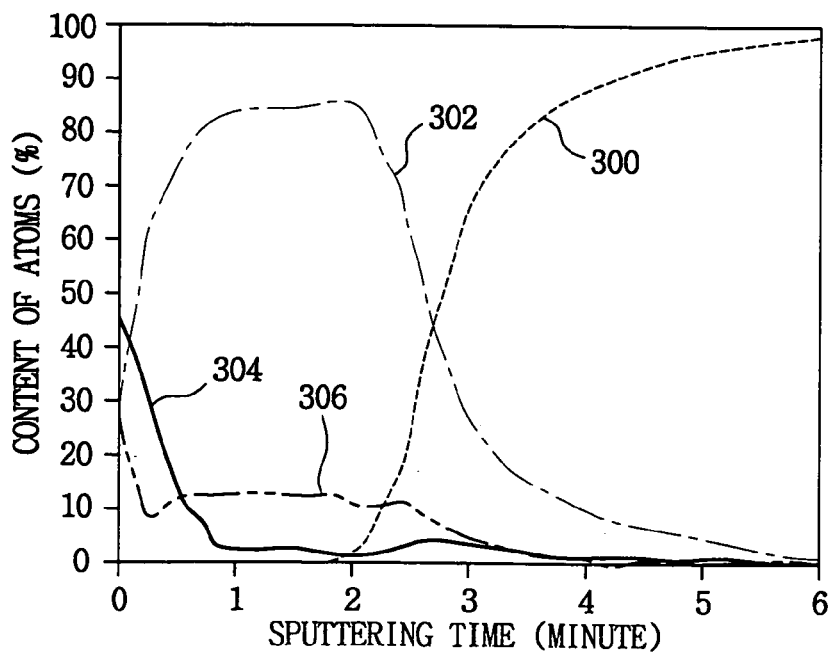
FIG. 11 presents a graph illustrating a result from an AES analysis of a conventional cobalt layer.

FIG. 10 presents a graph illustrating a result from an AES analysis of a cobalt layer according to embodiments of the present invention, and FIG. 11 presents a graph illustrating a result from an AES analysis of a conventional cobalt layer. In FIGS. 10 and 11, the X-axis represents a sputtering time and the Y-axis indicates a content of atoms. In addition, reference numerals 200 and 300 indicate contents of silicon, reference numerals 202 and 302 indicate contents of cobalt, reference numerals 204 and 304 indicate content of oxygen, and reference numerals 206 and 306 indicate contents of carbon.

Referring to FIG. 10, when a surface of the cobalt layer was treated with a hydrogen gas after forming a cobalt layer on a substrate by a CVD process, the cobalt layer included about 3 percent of carbon atoms and about 0.9 percent of oxygen atoms.

Referring FIG. 11, when a surface of the cobalt layer was not treated after forming the cobalt layer by a CVD process, the cobalt layer included about 13 percent of carbon atoms and about 3 percent of oxygen atoms.

EXAMPLE 11

Some embodiments of the present invention provide methods of forming cobalt layers on structures including a contact hole or on substrates having patterns.

Figure 12A:
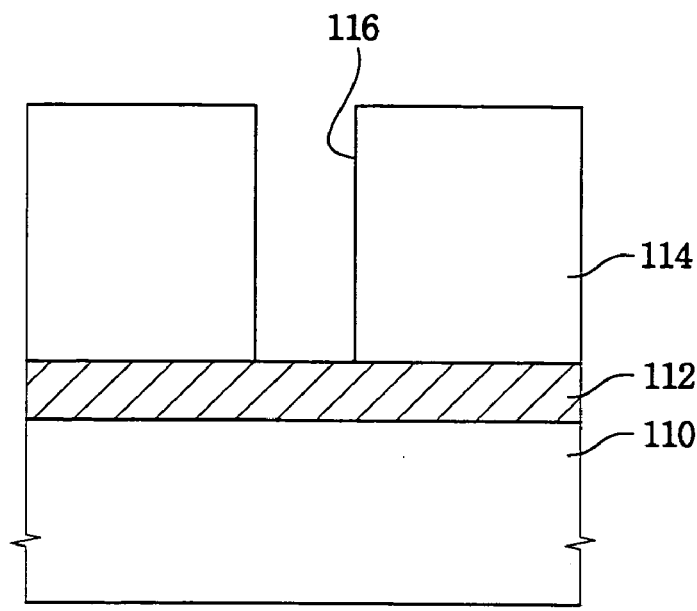
FIGS. 12A and 12B present cross-sectional views illustrating a method of forming a cobalt layer on a structure including a contact hole in accordance with some embodiments of the present invention.
Figure 12B:
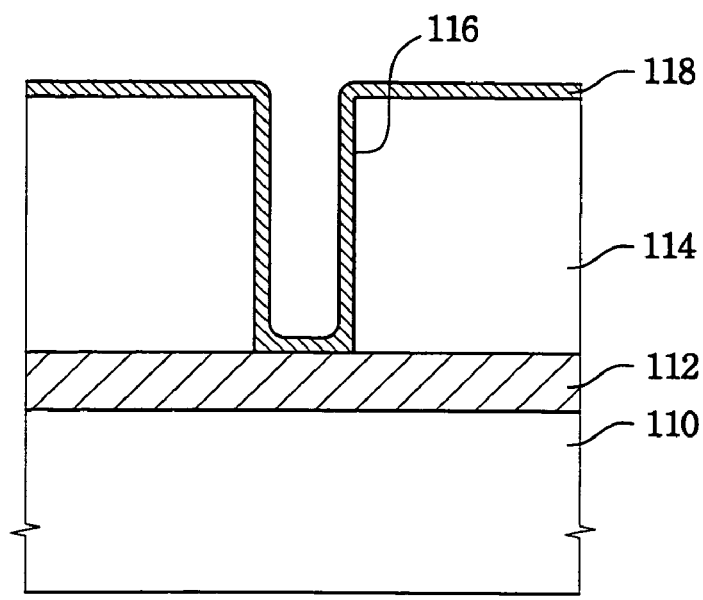

FIGS. 12A and 12B present cross-sectional views illustrating a method of forming a cobalt layer on a structure including a contact hole in accordance to some embodiments of the present invention.

Referring to FIG. 12A, after a polysilicon layer 112 is formed on a substrate 110, an insulating interlayer 114 can be formed on the polysilicon layer 112.

A predetermined portion of the insulating interlayer 114 can be etched to form a contact hole 116 exposing a portion of the polysilicon layer 112. Alternatively, the insulating interlayer 114 including the contact hole 116 may be treated using plasma.

Referring to FIG. 12B, a cobalt layer 118 is continuously formed on a sidewall and a bottom face of the contact hole 116, and on the insulating interlayer 114. In this instance, the cobalt layer 118 may be formed using any suitable process as described in the preceding examples.

A portion of the cobalt layer 118 positioned on the bottom face of the contact hole 116 may serve as an ohmic contact layer of cobalt silicide after performing a heating process involving the cobalt layer 118.

The cobalt layer 118 may demonstrate excellent step coverage and/or contain limited, if any, impurities therein so that resistance of a cobalt silicide layer formed from the cobalt layer 118 may be reduced, thereby decreasing a contact resistance at the bottom face of the contact hole 116.

Although the cobalt layer 118 is formed on the bottom face of contact hole 116 that contacts the underlying polysilicon layer 112, a cobalt layer may be formed in a contact region including silicon as an ohmic contact layer.

EXAMPLE 12

Figure 13A:
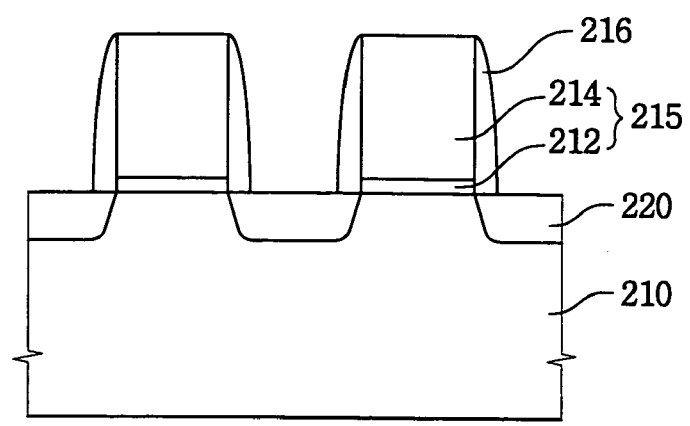
FIGS. 13A and 13B present cross-sectional views illustrating a method of forming a cobalt layer on a substrate having patterns for gate electrodes in accordance with some embodiments of the present invention.
Figure 13B:
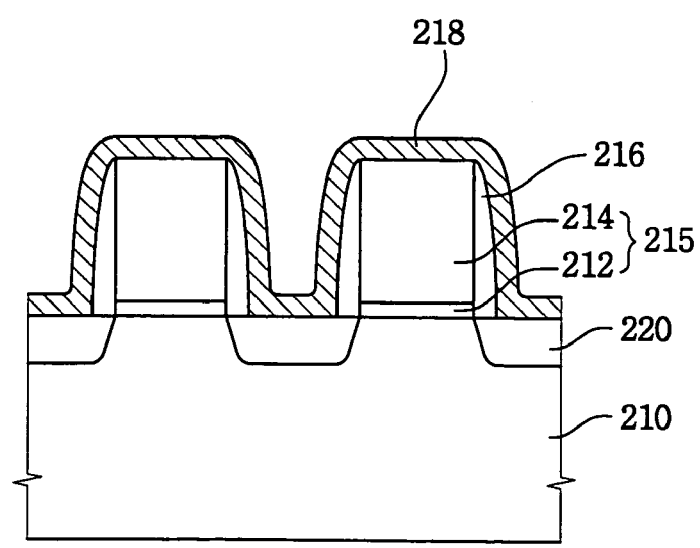

FIGS. 13A and 13B present cross-sectional views illustrating a method of forming a cobalt layer on a substrate having patterns for gate electrodes in accordance with some embodiments of the present invention.

Referring to FIG. 13A, gate electrodes 215 including gate oxide film patterns 212 and polysilicon film patterns 214 are formed on a substrate 210.

Source/drain regions 220 are formed at portions of the substrate 210 adjacent to the gate electrodes 215.

Spacers 216 are formed on sidewalls of the gate electrodes 215, respectively.

Referring to FIG. 13B, a cobalt layer 218 is formed on the substrate 210 on which the gate electrodes 215 including the spacers 216 are formed by any suitable process of the above-described examples of the present invention. The cobalt layer 218 may present excellent step coverage and/or includes substantially no impurities.

After forming the cobalt layer 218 on the substrate 210 including the gate electrodes 215, a cobalt silicide layer may be formed on the substrate 210 including the gate electrodes 215 by thermally treating the cobalt layer 218. In this instance, the cobalt silicide layer may be selectively formed on the gate electrodes 215 and on portions of the substrate 210 corresponding to contact regions such as source/drain regions. The cobalt silicide layer may exhibit low specific resistance, thereby reducing contact resistances of the gate electrodes 215 and the contact regions.

According to embodiments of the present invention, cobalt layers having a desirable step coverage and/or high purity may be formed. In addition, a cobalt silicide layer may be formed by thermally treating the cobalt layer wherein an oxide layer may be prevented from forming at an interface between the cobalt layer and an underlying silicon layer when the cobalt silicide layer is formed on the silicon layer.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of forming a cobalt layer, comprising:
   forming a first preliminary cobalt layer having a thickness of less than about 200 Å on a semiconductor substrate by exposing a surface of the semiconductor substrate to an organic metal precursor comprising cobalt while simultaneously reacting the organic metal precursor with a first hydrogen-containing gas;
   removing impurities from the first preliminary cobalt layer by exposing a surface of the first preliminary cobalt layer to a second hydrogen-containing gas; then
   forming a second preliminary cobalt layer on the first cobalt layer by exposing a surface of the first cobalt layer to an organic metal precursor while simultaneously reacting the organic metal precursor with the first hydrogen-containing gas.

2. The method of claim 1, wherein simultaneously reacting the organic metal precursor with a first hydrogen-containing gas comprises exposing the organic metal precursor to a first hydrogen-containing gas having a temperature in a range between about 100° C. and about 200° C.

3. The method of claim 1, wherein removing said impurities comprises removing impurities from the first preliminary cobalt layer by exposing a surface of the first preliminary cobalt layer to a second hydrogen-containing gas having a temperature of greater than about 300° C.

4. The method of claim 1, wherein removing said impurities comprises removing impurities from the first preliminary cobalt layer by exposing a surface of the first preliminary cobalt layer to a second hydrogen-containing gas comprising an inactive element selected from argon, neon, nitrogen and combinations thereof.

5. The method of claim 1, wherein the semiconductor substrate comprises silicon or a derivative thereof.

6. The method of claim 5, wherein the semiconductor substrate comprises tungsten suicide, titanium suicide, cobalt suicide or a combination thereof.

7. The method of claim 1, wherein forming the preliminary cobalt layer and treating the surface of the preliminary cobalt layer are repeatedly performed at least once so as to form a cobalt layer having a desired thickness on the semiconductor substrate.

8. The method of claim 1, wherein forming the preliminary cobalt layer is carried out by a chemical vapor deposition (CVD) process or an atomic layer deposition (ALD) process.

9. The method of claim 1, wherein the organic metal precursor comprises carbon, oxygen or a combination thereof.

10. The method of claim 1, wherein the organic metal precursor is a liquid.

11. The method of claim 1, wherein the organic metal precursor is $Co_2(CO)_6$:(HC≡CtBu), $Co(MeCp)_2$, $Co(CO)_3$(NO), $Co(CO)_2Cp$, $CoCp_2$, $Co_2(CO)_6$:(HC≡CPh), $Co_2(CO)_6$:(HC≡CH), $Co_2(CO)_6$:(HC≡CCH_3$) or $Co_2(CO)_6$:($CH_3C$≡$CCH_3$) and combinations thereof.

12. The method of claim 1, wherein the cobalt layer is further subjected to a silicidation process to provide a cobalt silicide layer.

13. The method of claim 1, wherein the cobalt layer is formed on a semiconductor substrate comprising a contact hole.

14. method of claim 13 further comprising forming a cobalt silicide layer on the gate electrodes and/or portions of the substrate corresponding to contact regions.

15. The method of claim 1, wherein the cobalt layer is formed on a semiconductor substrate having patterns for gate electrodes.

* * * * *

UNITED STATES PATENT AND TRADEMARK OFFICE
CERTIFICATE OF CORRECTION

PATENT NO.        : 7,211,506 B2
APPLICATION NO. : 10/881231
DATED             : May 1, 2007
INVENTOR(S)       : Moon et al.

It is certified that error appears in the above-identified patent and that said Letters Patent is hereby corrected as shown below:

On The Title Page:
Item (74): Please correct to read --Myers Bigel Sibley & Sajovec, P.A.--

In The Claims:

Claim 16, Line 1: Please correct claim 6 to read --The method of claim 5, wherein the semiconductor substrate comprises tungsten silicide, titanium silicide, cobalt silicide or a combination thereof.--

Signed and Sealed this

Twenty-first Day of August, 2007

JON W. DUDAS
*Director of the United States Patent and Trademark Office*